US012672467B2

(12) United States Patent　　　　(10) Patent No.: US 12,672,467 B2
Kim et al.　　　　　　　　　　　　　(45) Date of Patent: Jun. 30, 2026

(54) DISPLAY DEVICE INCLUDING PROTRUDING PATTERN PART IN INPUT SENSOR LAYER

(71) Applicant: Samsung Display Co., Ltd., Yongin-Si (KR)

(72) Inventors: Eunyoung Kim, Asan-si (KR); Deokjung Kim, Cheonan-si (KR); Gyeongnam Bang, Seoul (KR); Hyeyun Han, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 22 days.

(21) Appl. No.: 17/667,728

(22) Filed: Feb. 9, 2022

(65) Prior Publication Data

US 2022/0271097 A1　　Aug. 25, 2022

(30) Foreign Application Priority Data

Feb. 25, 2021　(KR) ........................ 10-2021-0025828

(51) Int. Cl.
　*H10K 59/80*　　　(2023.01)
　*H10K 59/12*　　　(2023.01)
　*H10K 59/40*　　　(2023.01)
(52) U.S. Cl.
　CPC ........... *H10K 59/873* (2023.02); *H10K 59/40* (2023.02); *H10K 59/12* (2023.02)
(58) Field of Classification Search
　CPC . H01L 51/52; H01L 51/5237; H01L 51/5253; H01L 51/5256; H10K 50/844; H10K 50/8445; H10K 59/844; H10K 59/8445
　See application file for complete search history.

(56) References Cited

U.S. PATENT DOCUMENTS

| | | | |
|---|---|---|---|
| 9,116,566 B2 | 8/2015 | Han et al. | |
| 9,632,487 B2 | 4/2017 | Kim et al. | |
| 10,230,069 B2 | 3/2019 | Choi et al. | |
| 10,541,380 B1 * | 1/2020 | Sung ................. | H10K 59/8731 |
| 12,075,640 B2 | 8/2024 | Kim et al. | |
| 2016/0315284 A1 * | 10/2016 | Jeon ................... | H10K 50/8445 |

(Continued)

FOREIGN PATENT DOCUMENTS

| | | |
|---|---|---|
| CN | 106098724 A | 11/2016 |
| CN | 111081732 A | 4/2020 |

(Continued)

OTHER PUBLICATIONS

Examination Report mailed Mar. 21, 2026, issued in corresponding Chinese Application No. 202210155767.6, 15 pages.

*Primary Examiner* — Jesse Y Miyoshi

(74) *Attorney, Agent, or Firm* — Innovation Counsel LLP

(57) ABSTRACT

Provided display device includes a display layer including a display area and a hole area which is disposed adjacent to the display area and in which a through-hole is defined and an input sensor layer disposed on the display layer and including a flat part including a conductive layer and at least one insulating layer and a protruding pattern part including the at least one insulating layer and provided to correspond to the hole area. Therefore, cracks that occur when a through-hole is formed may be reduced then the reliability and durability of the display device have been improved.

18 Claims, 12 Drawing Sheets

(56)            References Cited

U.S. PATENT DOCUMENTS

| | | | |
|---|---|---|---|
| 2020/0052243 | A1 | 2/2020 | Yeh et al. |
| 2020/0127231 | A1* | 4/2020 | Yun ..................... H10K 59/873 |
| 2020/0403047 | A1 | 12/2020 | Oh et al. |

FOREIGN PATENT DOCUMENTS

| | | | |
|---|---|---|---|
| CN | 111092102 | A | 5/2020 |
| CN | 112103310 | A | 12/2020 |
| KR | 20160000853 | A | 1/2016 |
| KR | 10-2016-0127873 | A | 11/2016 |
| KR | 10-2017-0015632 | A | 2/2017 |
| KR | 10-1735569 | B1 | 5/2017 |
| KR | 10-2017-0095444 | A | 8/2017 |
| KR | 10-2020-0044442 | A | 4/2020 |
| KR | 10-2020-0144627 | A | 12/2020 |

* cited by examiner

DISPLAY DEVICE INCLUDING PROTRUDING PATTERN PART IN INPUT SENSOR LAYER

CROSS-REFERENCE TO RELATED APPLICATIONS

This U.S. non-provisional patent application claims priority under 35 U.S.C. § 119 of Korean Patent Application No. 10-2021-0025828, filed on Feb. 25, 2021, the entire contents of which are hereby incorporated by reference.

BACKGROUND

The present disclosure herein relates to a display device including a sensor layer.

A display device may be constituted by various electronic components such as a display panel displaying an image, an input sensor sensing an external input, and an electronic module. The electronic components may be electrically connected to each other by signal lines. The electronic module may include a camera, an infrared sensor, or a proximity sensor. The electronic module may be disposed under the display panel and the input sensor. A hole for exposing the electronic module may be provided in the display panel and the input sensor. Thus, when the hole is formed, cracks may be propagated to the display panel and the input sensor due to stress during the formation of the hole to deteriorate reliability.

SUMMARY

The present disclosure provides a display device, in which crack propagation occurring when a hole is formed to expose an electronic module is minimized.

An embodiment of the inventive concept provides a display device includes: a display layer including a display area and a hole area which is disposed adjacent to the display area and in which a through-hole is defined; and an input sensor layer disposed on the display layer and including a flat part including a conductive layer and at least one insulating layer and a protruding pattern part including the at least one insulating layer and provided to correspond to the hole area.

In an embodiment, the display device may further include a planarization layer disposed between the display layer and the input sensor layer on the hole area, wherein the protruding pattern part may be disposed on the planarization layer and include a plurality of protrusions protruding from a top surface of the planarization layer and a recess part defined between the protrusions.

In an embodiment, each of the protrusions may have a ring shape surrounding the through-hole in a plan view.

In an embodiment, the input sensor layer may include a base insulating layer, a sensing insulating layer, and a cover insulating layer which are sequentially laminated, and the protrusions are formed including at least one of the base insulating layer, the sensing insulating layer, or the cover insulating layer.

In an embodiment, the flat part may include the base insulating layer, the sensing insulating layer, and the cover insulating layer which are sequentially laminated, and the protrusions may only include the cover insulating layer.

In an embodiment, the flat part may include the base insulating layer, the sensing insulating layer, and the cover insulating layer which are sequentially laminated, and the protrusions may include the base insulating layer and the sensing insulating layer and not comprise the cover insulating layer.

In an embodiment, the flat part may include the base insulating layer, the sensing insulating layer, and the cover insulating layer which are sequentially laminated, the protrusions may include the base insulating layer and the sensing insulating layer and may not include the cover insulating layer, and the protruding pattern part may further include the cover insulating layer that is filled into the recess part and covers the protrusions.

In an embodiment, a sidewall of the through-hole, which defines the through-hole, may include an exposed surface of a portion of the display layer, an exposed surface of the planarization layer, and an exposed surface of the cover insulating layer.

In an embodiment, a height of a top surface of the cover insulating layer at a portion adjacent to the through-hole may be higher than that of the top surface of the cover insulating layer at a portion spaced apart from the through-hole, wherein the height of the top surface may be a height from a top surface of the planarization layer to the top surface of the cover insulating layer.

In an embodiment, a top surface edge of the cover insulating layer at a portion adjacent to the through-hole may ascend in a direction away from the planarization layer.

In an embodiment, the input sensor layer may further include an edge flat part disposed between the protruding pattern part and the through-hole, and the edge flat part may include the base insulating layer, the sensing insulating layer, and the cover insulating layer which are sequentially laminated.

In an embodiment, a sidewall of the through-hole, which defines the through-hole, may include an exposed surface of a portion of the display layer and an exposed surface of the planarization layer.

In an embodiment, the display layer may include: a base layer; a circuit layer disposed on the base layer; a display element layer disposed on the circuit layer; and an encapsulation layer configured to cover the display element layer.

In an embodiment, the display layer may further include: a dam part disposed on the base layer to correspond to the hole area and protruding toward the planarization layer; and a crack dam disposed on the base layer between the dam part and the through-hole, protruding toward the planarization layer, and having a height less than that of the dam part.

In an embodiment, the crack dam may overlap the protruding pattern part, and the dam part overlaps the flat part.

In an embodiment, the protruding pattern part may overlap the dam part and does not overlap the crack dam in a plan view.

In an embodiment, the protruding pattern part may overlap the crack dam and the dam part in a plan view.

In an embodiment, the display layer may include a plurality of grooves that are concavely recessed in a direction of the base layer to correspond to the hole area and are defined in the circuit layer, and the protruding pattern part may overlap at least one of the grooves in a plan view.

In an embodiment of the inventive concept, a display device includes: a display layer including a display area and a hole area which is disposed adjacent to the display area and in which a through-hole is defined; and a planarization layer disposed on the display layer to correspond to the hole area; and an input sensor layer disposed on the display layer and including a conductive layer and at least one insulating layer. In one embodiment, the display layer includes: a base layer; a circuit layer disposed on the base layer; a display element layer disposed on the circuit layer; an encapsulation layer configured to cover the display element layer; and a crack dam disposed on the base layer to protrude toward the planarization layer and disposed to correspond to the hole area, wherein the input sensor layer may include a protruding pattern part disposed on the planarization layer to overlap the crack dam in a plan view, and the protruding pattern part including the at least one insulating layer.

In an embodiment, the at least one insulating layer may include a base insulating layer, a sensing insulating layer, and a cover insulating layer which are sequentially laminated, and the protruding pattern part may include: a plurality of protrusions formed by the cover insulating layer; and a recess part defined between the protrusions to expose a top surface of the planarization layer.

In an embodiment, each of the protrusions may have a ring shape surrounding the through-hole on a plane in a plan view.

In an embodiment of the inventive concept, a display device includes: an electronic module; and a display module including a display layer and an input sensor layer, in which a through-hole is defined, the through-hole overlaps the electronic module, and a planarization layer configured to surround the through-hole and disposed between the display layer and the input sensor layer, wherein the input sensor layer includes a protruding pattern part disposed on the planarization layer and disposed to surround the through-hole.

In an embodiment, the input sensor layer may include a base insulating layer, a sensing insulating layer, and a cover insulating layer which are sequentially laminated, and the protruding pattern part may include a plurality of protrusions which include at least one of the base insulating layer, the sensing insulating layer, and the cover insulating layer.

In an embodiment, the display layer may include: a base layer; a circuit layer disposed on the base layer; a display element layer disposed on the circuit layer; an encapsulation layer configured to cover the display element layer; and a crack dam disposed on the base layer to protrude toward the planarization layer and disposed adjacent to the through-hole, wherein the protruding pattern part may overlap the crack dam in a plan view.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 6 is a cross-sectional view of a display module according to an embodiment of the inventive concept;

FIG. 7 is a cross-sectional view of a display module according to an embodiment of the inventive concept;

FIG. 8 is a cross-sectional view of a display module according to an embodiment of the inventive concept;

FIG. 10 is a cross-sectional view of a display module according to an embodiment of the inventive concept;

FIG. 11 is a cross-sectional view of a display module according to an embodiment of the inventive concept;

FIG. 12 is a cross-sectional view of a display module according to an embodiment of the inventive concept; and FIG. 13 is a cross-sectional view of a display module according to an embodiment of the inventive concept.

DETAILED DESCRIPTION

Figure 1:
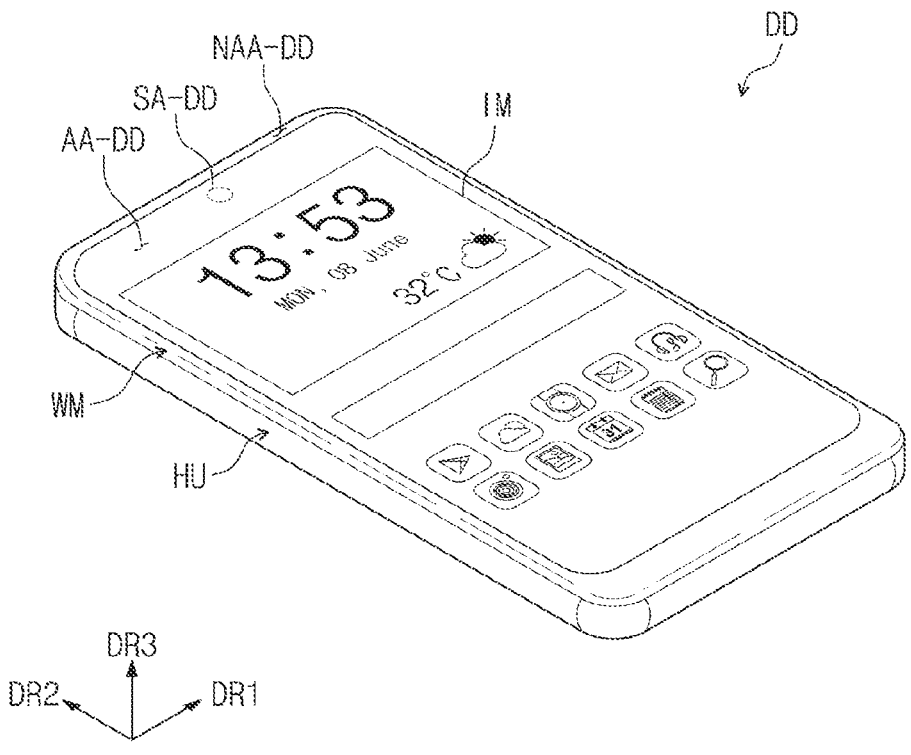
FIG. 1 is a perspective view of a display device according to an embodiment of the inventive concept.

Since the present disclosure may have diverse modified embodiments, specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the present disclosure.

In this specification, it will also be understood that when one component (or area, layer, portion) is referred to as being 'on', 'connected to', or 'coupled to' another component, it can be directly disposed/connected/coupled on/to the one component, or an intervening third component may also be present.

In this specification, "being directly disposed" may mean that there is no layer, film, area, plate, or the like between a portion of the layer, the layer, the area, the plate, or the like and the other portion. For example, "being directly disposed" may mean being disposed without using an additional member such and an adhesion member between two layers or two members.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of the elements illustrated in the drawings. The terms may be a relative concept and described based on directions expressed in the drawings. In this specification, the term "disposed on" may refer to a case in which it is disposed on a lower portion as well as an upper portion of any one member.

Unless otherwise defined, all terms (including technical and scientific terms) used herein have the same meaning as commonly understood by a person of ordinary skill in the art to which this invention belongs. In addition, terms such as terms defined in commonly used dictionaries should be interpreted as having a meaning consistent with the meaning in the context of the related technology, and unless explicitly defined here, they are interpreted as too ideal or too formal sense.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, a display device according to an embodiment of the inventive concept will be described with reference to the accompanying drawings.

Figure 2:
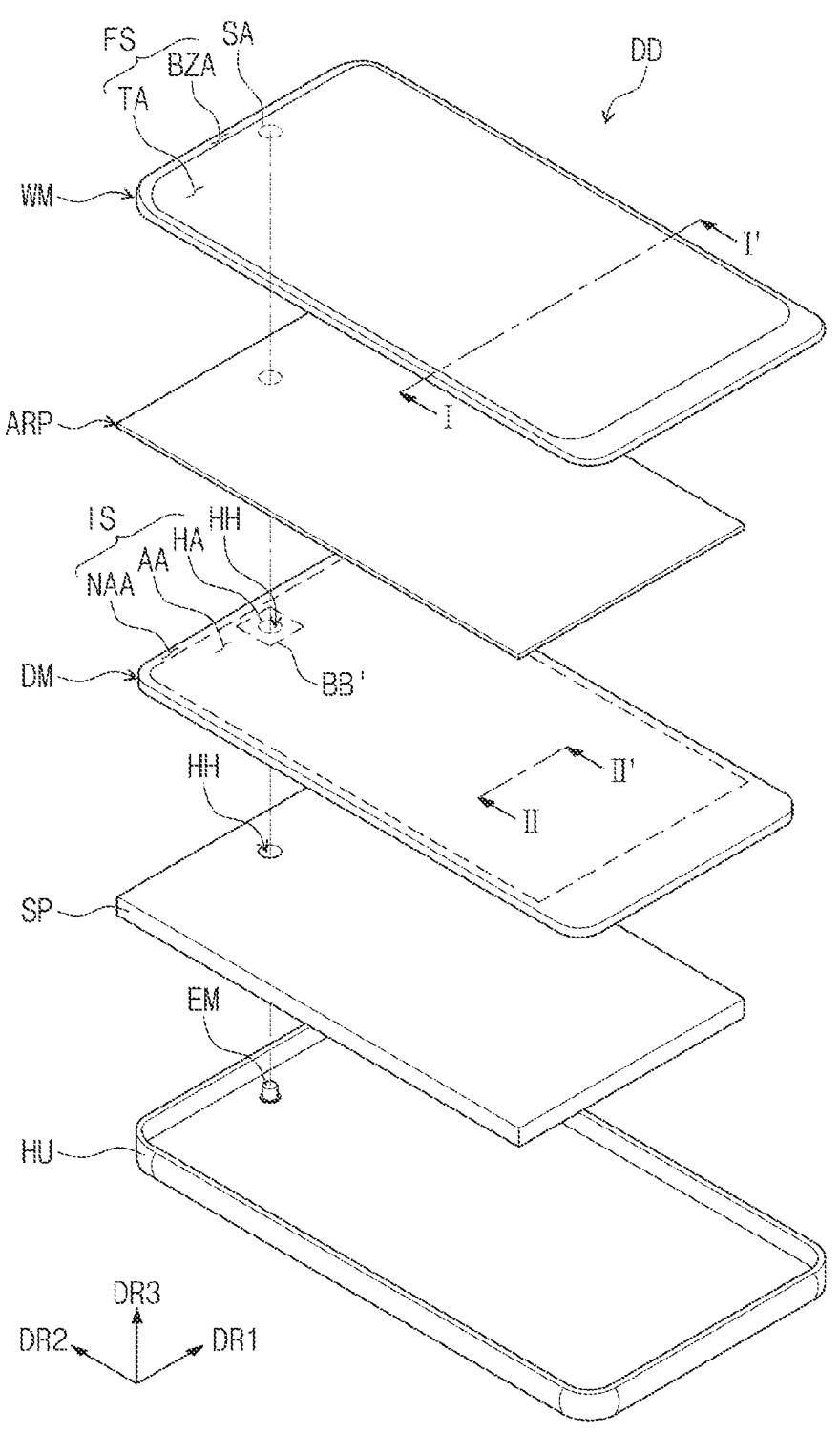
FIG. 2 is an exploded perspective view of the display device according to an embodiment of the inventive concept.
Figure 3:
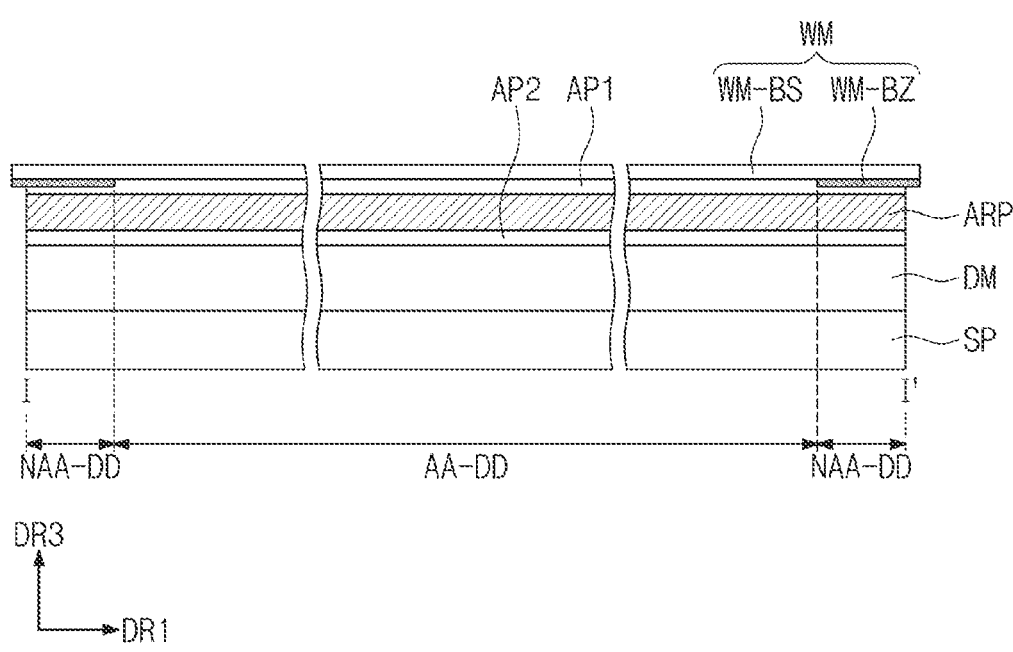
FIG. 3 is a cross-sectional view of the display device according to an embodiment of the inventive concept.

FIG. 1 is a perspective view of a display device according to an embodiment of the inventive concept. FIG. 2 is an exploded perspective view of the display device according to an embodiment of the inventive concept. FIG. 3 is a cross-sectional view of the display device according to an embodiment of the inventive concept. FIG. 3 is a schematic cross-sectional view of a portion corresponding to a line I-I' of FIG. 2.

A display device DD according to an embodiment may be a device that is activated according to an electrical signal. For example, the display device DD may be a mobile phone, a tablet PC, a car navigation system, a game console, or a wearable device, but the embodiment of the inventive concept is not limited thereto. FIG. 1 illustrates an example in which the display device DD is a mobile phone.

The display device DD according to an embodiment may include an active area AA-DD and a peripheral area NAA-DD. An image IM may be displayed on the active area AA-DD of the display device DD. In FIG. 1, the image IM is illustrated as a watch and a plurality of icons as an example. The active area AA-DD of the display device DD according to an embodiment may be a portion corresponding to a display area AA of a display module DM to be described later, and the peripheral area NAA-DD may be a portion corresponding to a non-display area NAA of the display module DM. In an embodiment, the active area AA-DD and the peripheral area NAA-DD of the display device DD may correspond to a transmission area TA and a bezel area BZA of a window WM.

The display device DD may display the image IM in a direction of a third directional axis DR3 on a display surface parallel to a plane defined by first and second directional axes DR1 and DR2. The display surface on which the image IM is displayed may correspond to a front surface of the display device DD and also correspond to a front surface FS of the window WM. In addition, the display device DD may have a solid shape having a predetermined thickness in the direction of the third directional axis DR3 that is perpendicular to the plane defined by the first directional axis DR1 and the second directional axis DR2.

In this embodiment, the front surface (or a top surface) or a rear surface (or a bottom surface) of each members may be defined based on a direction in which the image IM is displayed. The front and rear surfaces may be opposite to each other in the third directional axis DR3. A normal direction of each of the front and rear surfaces may be parallel to the third directional axis DR3. The directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

The active area AA-DD may have a quadrangular shape parallel to a plane defined by the first directional axis DR1 and the second directional axis DR2. However, this is merely an example. For example, the active area AA-DD may have various shapes and is not limited to a specific embodiment.

The peripheral area NAA-DD may be a light blocking area, i.e., an area that is disposed outside the active area AA-DD to surround the active area AA-DD. In an embodiment, the peripheral area NAA-DD may be disposed on a side surface of the display device DD rather than the front surface of the display device DD. In an embodiment, the peripheral area NAA-DD may be omitted.

A sensing area SA-DD may be defined in the active area AA-DD of the display device DD according to an embodiment. Although FIG. 1 illustrates one sensing area SA as an example, the number of sensing areas SA is not limited thereto.

An electronic module EM may be disposed on an area overlapping the sensing area SA-DD. The electronic module EM may receive an external input transmitted through the sensing area SA-DD or provide an output through the sensing area SA-DD.

The display device DD according to an embodiment may be a flexible display device. The "flexible" means a bendable property and may include a structure that is completely folded to a few nanometer. For example, the display device DD may be a curved display device or a foldable display device. Also, the display device DD may be rigid.

The display device DD according to an embodiment may include an electronic module EM, a display module DM disposed on the electronic module EM, and a light control layer ARP disposed on the display module DM. The display device DD according to an embodiment may include a window WM disposed on the display module DM. Also, the display device DD according to an embodiment may include a support member SP and a housing HU which are disposed under the display module DM. In the display device DD of FIGS. 1 and 2 according to an embodiment, the window WM and the housing HU may be coupled to each other to define an outer appearance of the display device DD. In an embodiment, a through-hole HH may be defined in the support member SP and the display module DM to overlap the electronic module EM.

In the display device DD according to an embodiment, the window WM may be disposed on the light control layer ARP. The window WM may include a base substrate WM-BS and a bezel pattern WM-BZ.

The base substrate WM-BS may be a substrate including an optically transparent insulating material. The base substrate WM-BS may have flexibility. For example, the base substrate WM-BS may include a polymer film, a substrate including a polymer material, or a thin glass substrate. Functional layers such as an anti-reflection layer, an anti-fingerprint layer, and an optical layer for controlling a phase may be further disposed on the base substrate WM-BS.

The bezel pattern WM-BZ may be a color layer printed on one surface of the base substrate WM-BS or a color layer deposited on the base substrate WM-BS. For example, the bezel pattern WM-BZ may have a multilayered structure. The multilayered structure may include a colored layer and/or a black light blocking layer. The colored color layer and the black light blocking layer may be formed through deposition, printing, and coating processes. The bezel pattern WM-BZ may be omitted and may be disposed on functional layers other than the base substrate WM-BS.

The window WM includes a front surface FS that is exposed to the outside. The transmission area TA of the window WM may be an optically transparent area. The transmission area TA may have a shape corresponding to the display area AA of the display module DM. For example, the transmission area TA overlaps an entire surface or at least a portion of the display area AA. An image displayed on the display area AA of the display module DM may be visible through the transmission area TA from the outside.

The bezel area BZA of the window WM may be disposed adjacent to the transmission area TA to surround the transmission area TA. The bezel area BZA may cover the non-display area NAA of the display module DM to prevent the non-display area NAA from being visible from the outside. The sensing area SA may be defined in the transmission area TA of the window WM. The sensing area SA of the window WM may be defined in an area corresponding to the sensing area SA-DD of the display device DD.

The display device DD according to an embodiment may include at least one adhesive layer AP1 and AP2. Some of the at least one adhesive layer AP1 and AP2 may be an optically clear adhesive layer. In addition, some of the at least one adhesive layer AP1 and AP2 may be omitted.

In the display device DD according to an embodiment, the electronic module EM may be an electronic component that outputs or receives an optical signal. For example, the electronic module EM may be a camera module that photographs an external image. Also, the electronic module EM may be a sensor module such as a proximity sensor or an infrared light emitting sensor.

In the display device DD according to an embodiment, the display module DM may be disposed on the electronic module EM. The display module DM may include a display area AA and a non-display area NAA disposed adjacent to the display area AA. That is, the front surface IS of the display module DM may include the display area AA and the non-display area NAA. The display area AA may be an area that is activated according to an electrical signal.

The non-display area NAA may be disposed adjacent to the display area AA. The non-display area NAA may surround the display area AA. A driving circuit or driving line for driving the display area AA, various signal lines or pads providing an electrical signal to the display area AA, or electronic elements may be disposed on the non-display area NAA.

In the display module DM according to an embodiment, the hole area HA may be defined in the display area AA. A through-hole HH passing through the display layer DP (see FIG. 4) and the input sensor layer TP (see FIG. 4) of the display module DM may be defined in the hole area HA. The hole area HA may be formed in an area correspond to the sensing area SA-DD of the display device DD. The through-hole HH defined in each of the display layer DP (see FIG. 4) and the input sensor layer TP (see FIG. 4) may be formed in an area corresponding to the electronic module EM.

In the display device DD according to an embodiment, the light control layer ARP may be disposed above the display module DM. The light control layer ARP may be disposed between the display module DM and the window WM. The light control layer ARP may perform an anti-reflection function of reducing reflection of light incident from the outside of the display device DD. In an embodiment, the light control layer ARP may be a polarizing plate or a color filter layer including a plurality of filter parts.

The support member SP disposed under the display module DM may include a cushion layer and a metal support layer. The through-hole HH may be defined in the support member SP. The through-hole HH may be defined in an area corresponding to the hole area HA of the display module DM. The through-hole HH may be a portion corresponding to the sensing area SA-DD of the display device DD.

The electronic module EM may be formed in an area corresponding to the through-hole HH. At least a portion of the electronic module EM may be inserted and disposed in the through-hole HH.

Figure 4:
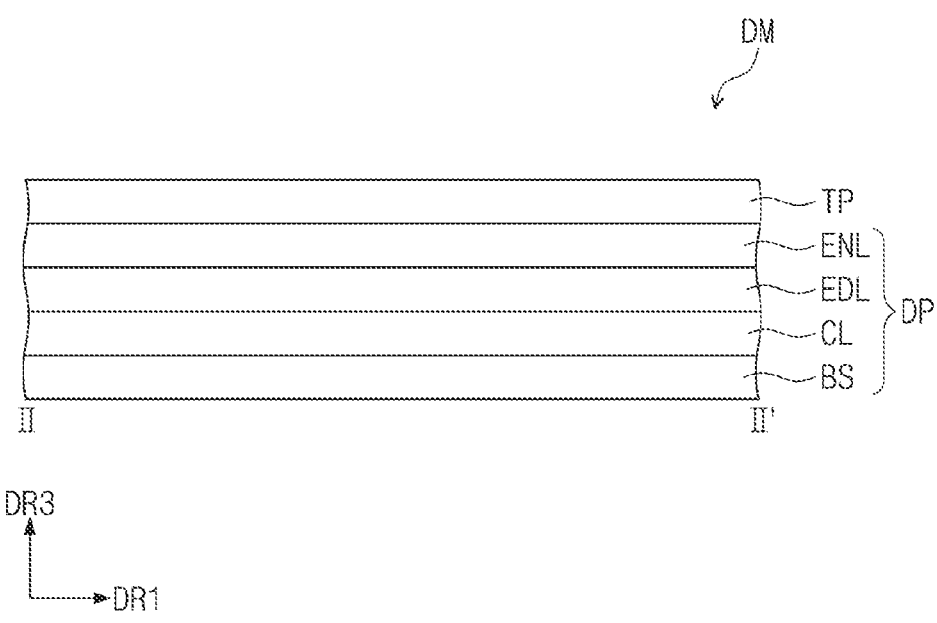
FIG. 4 is a cross-sectional view of a display module according to an embodiment of the inventive concept.

FIG. 4 is a cross-sectional view illustrating a portion of the display module according to an embodiment. FIG. 4 is a cross-sectional view illustrating a portion corresponding to a line II-IP of FIG. 2.

The display module DM according to an embodiment may include a display layer DP and an input sensor layer TP disposed on the display layer DP. The display layer DP includes a base layer BS, a circuit layer CL disposed on the base layer BS, a display element layer EDL, and an encapsulation layer ENL. The input sensor layer TP may be disposed on the encapsulation layer ENL. The encapsulation layer ENL may cover the display element layer EDL.

The base layer BS may provide a base surface on which the display element layer EDL is disposed. The base layer BS may include a glass substrate, a metal substrate, a polymer substrate, and the like. However, the embodiment of the inventive concept is not limited thereto. For example, the base layer BS may be an inorganic layer, an organic layer, or a composite layer.

The base layer BS may have a multilayered structure. For example, the base layer BS may have a three-layered structure constituted by a synthetic resin layer, an adhesive layer, and a synthetic resin layer. Particularly, the synthetic resin layer may include a polyimide-based resin. Also, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "~~-based" resin means as including a functional group of "~~".

The circuit layer CL may be disposed on the base layer BS. The circuit layer CL may include an insulating layer, a semiconductor pattern, a conductive pattern, and a signal line. The insulating layer, the semiconductor layer, and the conductive layer may be disposed on the base layer BS in a manner such as coating or deposition, and then, the insulating layer, the semiconductor layer, and the conductive layer may be selectively patterned through a plurality of photolithography processes. Thereafter, the semiconductor pattern, the conductive pattern, and the signal line included in the circuit layer CL may be provided. A configuration of the circuit layer CL will be described in detail later.

The display element layer EDL may be disposed on the circuit layer CL. The display element layer EDL may include a light emitting element ED (see FIG. 6). For example, the display element layer EDL may include an organic light emitting element, a quantum dot light emitting element, a micro LED light emitting element, or a nano LED light emitting element.

The encapsulation layer ENL may be disposed on the display element layer EDL. The encapsulation layer ENL may include at least one inorganic layer and at least one organic layer. For example, the encapsulation layer ENL may include an inorganic layer, an organic layer, and an inorganic layer which are sequentially laminated, but layers constituting the encapsulation layer ENL are not limited thereto.

The input sensor layer TP may be disposed on the display layer DP. The input sensor layer TP may sense an external input applied from the outside. The external input may be a user's input. The user's input may include various types of external inputs such as a portion of user's body, light, heat, a pen, a pressure, or the like.

The input sensor layer TP may be disposed on the display layer DP through a continuous process. In this case, the input sensor layer TP may be expressed as being directly disposed on the display layer DP. The direct disposition may mean that a third component is not disposed between the input sensor layer TP and the display layer DP. That is, a separate adhesive member may not be disposed between the input sensor layer TP and the display layer DP. For example, the input sensor layer TP may be directly disposed on the encapsulation layer ENL.

Figure 6:
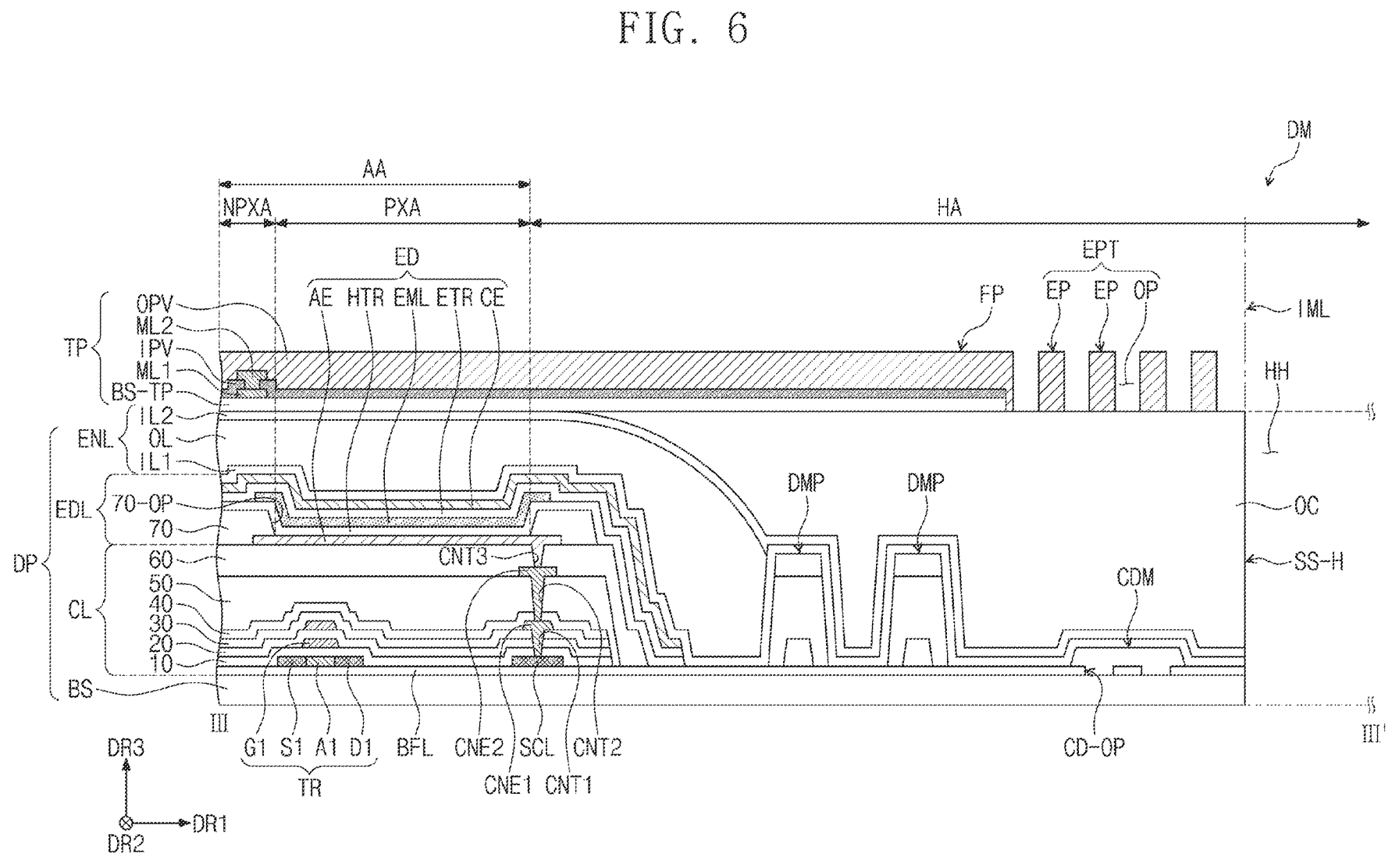

The display element layer EDL includes a display element, for example, a light emitting element ED (see FIG. 6). The display element layer EDL may further include a pixel defining layer 70 (see FIG. 6).

The light emitting element ED (see FIG. 6) of the display element layer EDL may be disposed on the display area AA (see FIG. 2). The light emitting element may not be disposed on the non-display area NAA. Also, the light emitting element may not be disposed on the hole area HA (see FIG. 2).

Figure 5:
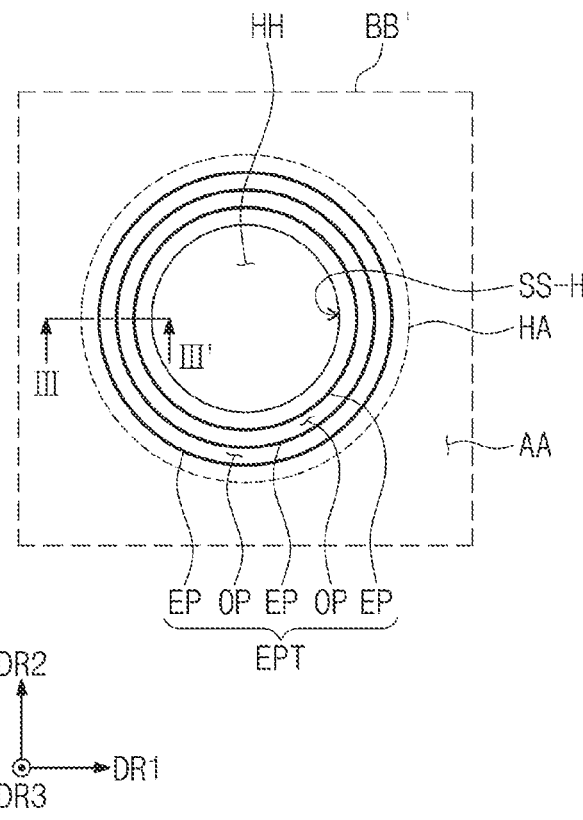
FIG. 5 is a plan view illustrating a portion of the display device according to an embodiment of the inventive concept.

FIG. 5 is a plan view illustrating a portion of the display module according to an embodiment of the inventive concept. FIG. 5 is a plan view illustrating an area BB' of FIG. 2.

A through-hole HH may be defined in the hole area HA of the display module according to an embodiment, and a protruding pattern part EPT may be disposed to surround the through hole HH. The through-hole HH may be defined by removing a portion of each of the display layer DP (see FIG. 4) and the input sensor layer TP (see FIG. 4). The through-hole HH may be defined as a sidewall SS-H, and the sidewall SS-H may be an exposed surface that is exposed by removing a portion of each of the display layer DP (see FIG. 4) and the input sensor layer TP (see FIG. 4).

The protruding pattern part EPT may have a ring shape on a plane. For example, each of protrusions EP constituting the protruding pattern part EPT may have a ring shape completely surrounding the through-hole HH. The protruding pattern part EPT may be constituted by a plurality of protrusions EP and a plurality of recess parts OP each defined between adjacent protrusions EP. The protruding pattern part EPT may be disposed in the hole area HA and may be provided as at least one insulating layer included in the input sensor layer TP.

FIG. 6 is a cross-sectional view illustrating a portion of the display module according to an embodiment. FIG. 6 is a cross-sectional view of a portion corresponding to a line of FIG. 5. FIG. 6 illustrates an example of a display module DM including a hole area HA, in which the through-hole HH is defined, a display area AA adjacent to the hole area HA, and a protruding pattern part EPT provided to correspond to the hole area HA.

In an embodiment, the display module DM may include a display area AA and a hole area HA which is disposed adjacent to the display area AA and in which a through-hole HH is defined. Also, referring to FIG. 6, the display layer DP may include a display area AA and a hole area HA disposed adjacent to the display area AA and in which a through-hole HH is defined.

In an embodiment, the display area AA may include a pixel area PXA and a non-pixel area NPXA disposed adjacent to the pixel area PXA. In FIG. 6, only one pixel area PXA of the display area AA disposed adjacent to the hole area HA is illustrated, but a plurality of pixel areas PXA are disposed on the entire display area AA in the display module DM according to an embodiment, and a non-pixel area NPXA may be disposed between the pixel areas PXA. The non-pixel area NPXA may surround the pixel area PXA. In an embodiment, the pixel area PXA may be defined to correspond to a portion of an area of a first electrode AE which is exposed by an opening 70-OP.

Referring to FIG. 6, at least one inorganic layer is disposed on a top surface of the base layer BS in the display layer DP. The inorganic layer may include at least one of aluminum oxide, titanium oxide, silicon oxide, silicon nitride, or silicon oxynitride. The inorganic layer may be provided as a multilayer. The multilayered inorganic layer may constitute a barrier layer and/or a buffer layer. In this embodiment, the display layer DP may include the buffer layer BFL.

The buffer layer BFL may improve bonding force between the base layer BS and the semiconductor pattern. The buffer layer BFL may include at least one of a silicon oxide layer, a silicon nitride layer, or a silicon oxynitride layer. For example, the buffer layer BFL may be provided by alternately laminating two or more layers selected from the silicon oxide layer, the silicon nitride layer, and the silicon oxynitride layer.

The semiconductor pattern may be disposed on the buffer layer BFL. The semiconductor pattern may include polysilicon. However, the embodiment of the inventive concept is not limited thereto. For example, the semiconductor pattern may include amorphous silicon or metal oxide.

FIG. 6 illustrates merely a portion of the semiconductor pattern. For example, the semiconductor pattern may be further disposed on other areas. The semiconductor pattern may be arranged to have a predetermined configuration in pixels over the pixel area PXA. The semiconductor pattern has different electrical properties depending on whether the semiconductor pattern is doped. The semiconductor pattern may include a first region having high conductivity and a second region having low conductivity. The first region may be doped with an N-type dopant or a P-type dopant. The second region may be referred to a channel region.

The first region may have conductivity greater than that of the second region and may substantially serve as an electrode or a signal line. The second region may substantially correspond to an active (or channel) of the transistor. That is to say, a portion of the semiconductor pattern may be an active of the transistor, another portion of the semiconductor pattern may be a source or drain of the transistor, and further another portion of the semiconductor pattern may be a connection electrode or a connection signal line.

Each of the pixels may have an equivalent circuit including a plurality of transistors, one or plurality of capacitors, and a light emitting element, and an equivalent circuit diagram of the pixels may be modified in various forms. In FIG. 6, one transistor TR and light emitting element ED which are included in the pixel are illustrated as an example.

A source S1, an active A1, and a drain D1 of the transistor TR may be formed of a semiconductor pattern. The source S1 and the drain D1 may extend in opposite directions from the active A1. FIG. 6 illustrates a portion of a connection signal line SCL formed of the semiconductor pattern. Although not particularly shown, the connection signal line SCL may be connected to the drain D1 of the transistor TR in a plan view.

A first insulating layer 10 may be disposed on the buffer layer BFL. The first insulating layer 10 commonly overlaps the plurality of pixels PX to cover the semiconductor pattern. The first insulating layer 10 may include an inorganic layer and/or an organic layer and have a single-layered or multilayered structure. The first insulating layer 10 may include at least one of aluminum oxide, titanium oxide, silicon oxide, silicon nitride, or silicon oxynitride. In this embodiment, the first insulating layer 10 may include a single-layered silicon oxide layer. The insulating layer of the circuit layer CL, which will be described later, as well as the first insulating layer 10 may be an inorganic layer and/or an organic layer and may have a single-layered or a multilayered structure. The inorganic layer may include at least one of the above-described materials, but is not limited thereto.

The gate G1 of the transistor TR is disposed on the first insulating layer 10. Each of the gate G1 may be a portion of a metal pattern. The gate G1 overlaps the active A1. In the process in which the semiconductor pattern is doped, the gate G1 may function as a self-aligned mask.

A second insulating layer 20 may be disposed on the first insulating layer 10 to cover the gate G1. A second insulating layer 20 may commonly overlap the pixels. The second insulating layer 20 may be an inorganic layer and/or an organic layer and may have a single-layered or multilayered structure including at least one of a silicon oxide layer, a silicon nitride layer, or a silicon oxynitride layer.

A third insulating layer 30 may be disposed on the second insulating layer 20 and may have a single-layered or multilayered structure including at least one of a silicon oxide layer, a silicon nitride layer, or a silicon oxynitride layer.

A first connection electrode CNE1 may be disposed on the third insulating layer 30. The first connection electrode CNE1 may be connected to the signal line SCL through a contact hole CNT1 passing through the first to third insulating layers 10 to 30.

A fourth insulating layer 40 may be disposed on the third insulating layer 30 and first connection electrode CNE1. The fourth insulating layer 40 may have a single-layered or multilayered structure including at least one of a silicon oxide layer, a silicon nitride layer, or a silicon oxynitride layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT2 passing through the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer.

The display layer DP may include a dam part DMP. The dam part DMP may be disposed on the base layer BS. The dam part DMP may be constituted by a plurality of insulating layers. The dam part DMP may prevent an organic layer OL, which will be described later, from being overflowed to the through hole HH. Also, although FIG. 6 illustrates an example in which two dam parts DMP are provided, the number of dam parts DMP is not limited thereto. For example, only one dam part DMP may be disposed, or three or more dam parts DMP may be provided.

The display layer DP may include a crack dam CDM. The crack dam CDM may be provided on the base layer BS of the display layer DP. The crack dam CDM may be disposed closer to the through-hole HH than the dam part DMP. The crack dam CDM may serve to prevent cracks from being propagated to the circuit layer CL and the display element layer EDL when the cracks occur due to stress during the formation of the through-hole HH.

The crack dam CDM may be disposed to protrude from the base layer BS. The crack dam CDM may be disposed on the base layer BS and protrudes toward a planarization layer OC to correspond to the hole area HA. The crack dam CDM may be disposed to be filled into a groove CD-OP defined in the buffer layer BFL. The crack dam CDM may be provided as at least one insulating layer.

The dam part DMP may have a structure in which a plurality of layers are laminated. For example, the dam part DMP may be formed in the same process as some of the insulating layers 10 to 60 of the circuit layer CL of the display layer DP or the pixel defining layer 70.

Referring to FIG. 6, in an embodiment, a height of the crack dam CDM may be less than that of the dam part DMP. Although FIG. 6 illustrates a structure in which the two dam parts DMP have the same height, the embodiment of the inventive concept is not limited thereto, and at least one of the dam parts DMP may have a height different from that of each of other dam parts DMP.

The display element layer EDL including the light emitting element ED may be disposed on the circuit layer CL. The light emitting element ED may include a first electrode AE, an emission layer EML, and a second electrode CE. The first electrode AE may be disposed on the sixth insulating layer 60. The first electrode AE may be connected to the second connection electrode CNE2 through a contact hole CNT3 passing through the sixth insulating layer 60.

A pixel defining layer 70 may be disposed on the sixth insulating layer 60 to cover a portion of the first electrode AE. An opening 70-OP is defined in the pixel defining layer 70. The opening 70-OP of the pixel defining layer 70 exposes at least a portion of the first electrode AE.

The emission layer EML may be disposed on the first electrode AE. The emission layer EML may be disposed in the opening 70-OP. That is, the emission layer EML may have an island shape which is separated from emission layers disposed in other pixels PX. Each of the emission layers EML disposed in pixels PX may emit light having at least one of blue, red, or green color. However, the embodiment of the inventive concept is not limited thereto. For example, the emission layer EML may be a common layer which is commonly disposed in the pixels PX. In this case, the emission layer EML may provide blue light or white light. The emission layer EML may include an organic light emitting material or a quantum dot material.

A hole transport region HTR may be disposed on the first electrode AE. The hole transport region HTR may be commonly disposed on the pixel area PXA and the non-pixel area NPXA. The hole transport region HTR may include a hole transport layer and may further include a hole injection layer.

An electron transport region ETR may be disposed on the emission layer EML. The electron transport region ETR may include an electron transport layer and may further include an electron injection layer. The hole transport region HTR and the electron transport region ETR may be commonly formed in the plurality of pixels. However, the embodiment of the inventive concept is not limited thereto, and the hole transport region HTR and the electron transport region ETR may be patterned to correspond to the pixel area PXA.

The second electrode CE may be disposed on the electronic transport region ETR. The second electrode CE may be a common layer which is commonly disposed on the plurality of pixels.

The encapsulation layer ENL may be disposed on the display element layer EDL. The encapsulation layer ENL may be disposed on the second electrode CE. The encapsulation layer ENL may include a first inorganic layer IL1, an organic layer OL, and a second inorganic layer IL2. The first inorganic layer IL1, the organic layer OL, and the second inorganic layer IL2 may protect the display element layer EDL from moisture/oxygen and prevent foreign substances such as dust particles from being introduced. Each of the first inorganic layer IL1 and the second inorganic layer IL2 may include at least one of silicon nitride, silicon oxynitride, or silicon oxide. For example, in an embodiment, each of the first inorganic layer IL1 and the second inorganic layer IL2 may include titanium oxide or aluminum oxide, but the embodiment of the inventive concept is not limited thereto. The organic layer OL may include an acrylic-based resin. However, this embodiment of the inventive concept is not limited thereto.

The display module DM according to an embodiment may include a planarization layer OC. The planarization layer OC may be disposed between the display layer DP and the input sensor layer TP on the hole area HA.

The planarization layer OC may be disposed on the encapsulation layer ENL. For example, the planarization layer OC may be disposed on the hole area HA in which the through-hole HH is defined and may surround the through-hole HH. The planarization layer OC may be made of an organic material. The planarization layer OC may be filled in a space between the encapsulation layer ENL and the input sensor layer TP. For example, the planarization layer OC may cover a non-flat surface formed by disposing the dam part DMP, the crack dam CDM, and the like to provide a flat surface thereon. Thus, a flat surface may be provided even in an area which is adjacent to the through-hole HH and on which the organic layer OL is not disposed.

The input sensor layer TP may be disposed on the display layer DP and the planarization layer OC. The input sensor layer TP may include conductive layers ML1 and ML2 and at least one insulating layer BS-TP, IPV, and OPV. The input sensor layer TP may include a base insulating layer BS-TP, a first conductive layer ML1, a sensing insulating layer IPV, a second conductive layer ML2, and a cover insulating layer OPV. The input sensor layer TP may be formed by a continuous process after forming the display layer DP. However, the embodiment of the inventive concept is not limited thereto.

The base insulating layer BS-TP may be an inorganic layer including any one of silicon nitride, silicon oxynitride, and silicon oxide. Alternatively, the base insulating layer BS-TP may be an organic layer including an epoxy resin, an acrylic resin, or an imide-based resin. The base insulating layer BS-TP may have a single-layered structure or a multilayered structure in which a plurality of layers are laminated along the third directional axis DR3.

Each of the first conductive layer ML1 and the second conductive layer ML2 may have a single-layered structure or a multilayered structure in which a plurality of layers are laminated along the third directional axis DR3. Each of the single-layered conductive layers ML1 and ML2 may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), and the like. Also, the transparent conductive layer may include a conductive polymer such as PEDOT, a metal nanowire, graphene, and the like.

The multilayered conductive layers ML1 and ML2 may include metal layers. The metal layers may have, for example, a three-layered structure of titanium (Ti)/aluminum (Al)/titanium (Ti). The multilayered conductive layers ML1 and ML2 may include at least one metal layer and at least one transparent conductive layer.

The sensing insulating layer IPV and the cover insulating layer OPV may be made of an inorganic material or an organic material, respectively. For example, the sensing insulating layer IPV may include at least one of aluminum oxide, titanium oxide, silicon oxide, silicon nitride, silicon oxynitride, zirconium oxide, or hafnium oxide. Also, for example, the cover insulating layer OPV may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The input sensor layer TP may include a flat part FP and a protruding pattern part EPT. The flat part FP may include conductive layers ML1 and ML2 and at least one insulating layer BS-TP, IPV, and OPV. Also, the flat part FP on the hole area HA may include the laminated insulating layers BS-TP, IPV, and OPV. Also, the input sensor layer TP may include a protruding pattern part EPT provided as at least one insulating layer BS-TP, IPV, and OPV on the hole area HA.

The protruding pattern part EPT may include a plurality of protrusions EP disposed on the planarization layer OC to protrude from a top surface of the planarization layer OC and at lease one recess part OP defined between the protrusions EP. Although four protrusions EP are illustrated in FIG. 6, the number of protrusions EP, a size of each of the protrusions EP, and a space between the protrusions EP are not limited thereto. For example, the width of each of the protrusions EP may gradually increase as a distance from the through-hole HH to the protrusions EP increases. Also, the protrusions EP in the direction of the first directional axis DR1 may not have the same width, but have random widths. A width of the recess part OP corresponding to the spacing between adjacent protrusions EP in the direction of the first directional axis DR1 may also gradually increase as a distance from the through-hole HH to the recess part OP increases or gradually increase to have a random width.

A top surface of the planarization layer OC may be exposed in the recess part OP. A portion the planarization layer OC of the display module DM may be exposed in the recess part OP at a portion overlapping the crack dam CDM.

A height of each of the protrusions EP in the direction of the third directional axis DR3 may correspond to that of the flat part FP. For example, each of the protrusions EP may be provided to have the same height as the flat part FP to reduce a height difference on the top surface of the display module DM.

In the embodiment illustrated in FIG. 6, the protrusions EP may be formed in the same process as the cover insulating layer OPV. Each of the protrusions EP may be made of a material of the cover insulating layer OPV. For example, in an embodiment, the protrusions EP may include only the cover insulating layer OPV.

Referring to FIG. 6, the protruding pattern part EPT may overlap the crack dam CDM in a plan view. In the display module DM according to an embodiment, the protrusion EP of the protruding pattern part EPT, which is closest to the through-hole HH, may be disposed to be spaced apart from the sidewall SS-H. In an embodiment, an extension surface of the sidewall SS-H, which serves as a cutting line defining the through-hole HH, and an edge of the protrusion EP may not match each other. That is, the edge of the protrusion EP adjacent to the through-hole HH in the protruding pattern part EPT may not match a virtual extension surface IML extending from the sidewall SS-H. However, the embodiment of the inventive concept is not limited thereto. For example, the edge of the protrusion EP may match the virtual extension surface IML extending from the sidewall SS-H.

In the display module DM of FIG. 6 according to an embodiment, the protruding pattern part EPT may overlap the crack dam CDM and may not overlap the dam part DMP in a plan view. In the display module DM according to an embodiment, the dam part DMP may overlap the flat part FP on which the insulating layers BS-TP, IPV, and OPV are laminated in a plan view.

Portions of the display layer DP, the planarization layer OC, and the input sensor layer TP may be exposed through the sidewall SS-H defining the through-hole HH. In the display module DM of FIG. 6 according to an embodiment, the sidewall SS-H may be defined as an exposed surface of a portion of the display layer DP and an exposed surface of the planarization layer OC. In an embodiment, the sidewall SS-H may be defined by the base layer BS, a portion of the circuit layer CL, a portion of the encapsulation layer ENL, and a portion defined by exposing the planarization layer OC.

In the display device according to an embodiment, a protruding pattern part provided as at least one insulating layer of the input sensor layer may be disposed around the through-hole to prevent the cracks from occurring and being propagated to the display area due to the stress generated when the through-hole is formed, thereby improving the reliability and the durability.

Hereinafter, a display module according to an embodiment of the inventive concept will be described with reference to FIGS. 7 to 13. Hereinafter, in the description of the display module according to an embodiment, description with reference to FIGS. 1 to 6 above will not be described again, and differences therebetween will be mainly described.

Figure 7:
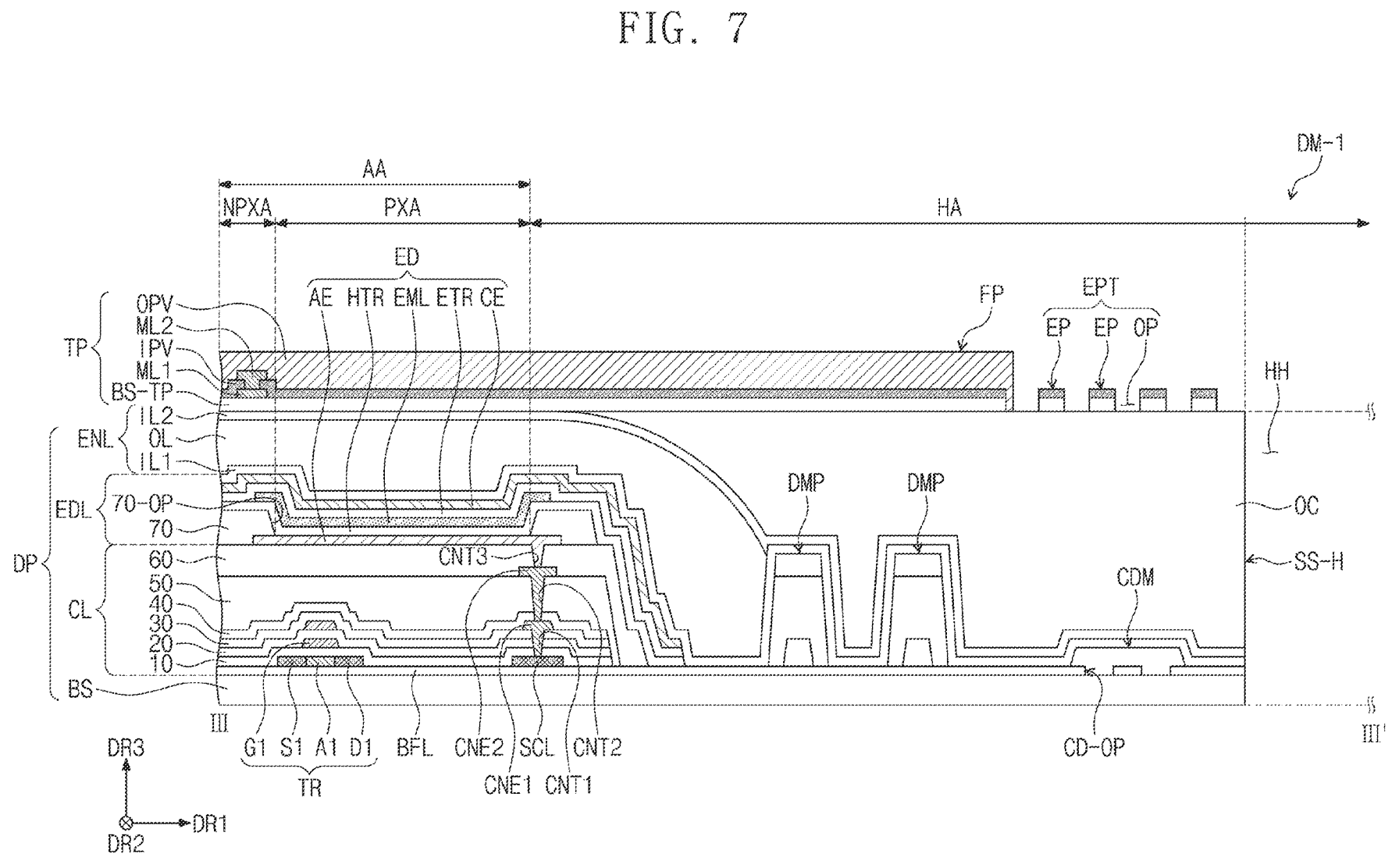

A display module DM-1 of FIG. 7 according to an embodiment is different from the display module DM of FIG. 6 in a configuration of a protruding pattern part EPT. In the display module DM-1 according to an embodiment, the protruding pattern part EPT includes a plurality of protrusions EP and at least one recess part OP defined between the protrusions EP. Also, in an embodiment, each of the protrusions EP may include a base insulating layer BS-TP and a sensing insulating layer IPV.

In an embodiment, each of the protrusions EP may include a base insulating layer BS-TP and a sensing insulating layer IPV and also may not include a cover insulating layer OPV. A top surface of a planarization layer OC may be exposed in the recess part OP.

Also, in an embodiment illustrated in FIG. 7, the protruding pattern part EPT may overlap a crack dam CDM and may not overlap a dam part DMP in a plan view. Also, the dam part DMP may overlap a flat part FP.

In an embodiment illustrated in FIG. 7, a height of the protrusion EP in the direction of the third directional axis DR3 may be less than that of the flat part FP. Since the height of the protrusion EP adjacent to a through-hole HH is less than that of the flat part FP, a height of a neutral plane of an input sensor layer TP around the through-hole HH may decrease to reduce stress generated when the through-hole is formed.

In an embodiment illustrated in FIG. 7, similar to the embodiment illustrated in FIG. 6, an edge of the protrusion EP adjacent to the through-hole HH may be spaced apart from a sidewall SS-H. However, the embodiment of the inventive concept is not limited thereto. For example, the edge of the protrusion EP may match a virtual extension surface extending from the sidewall SS-H.

Figure 8:
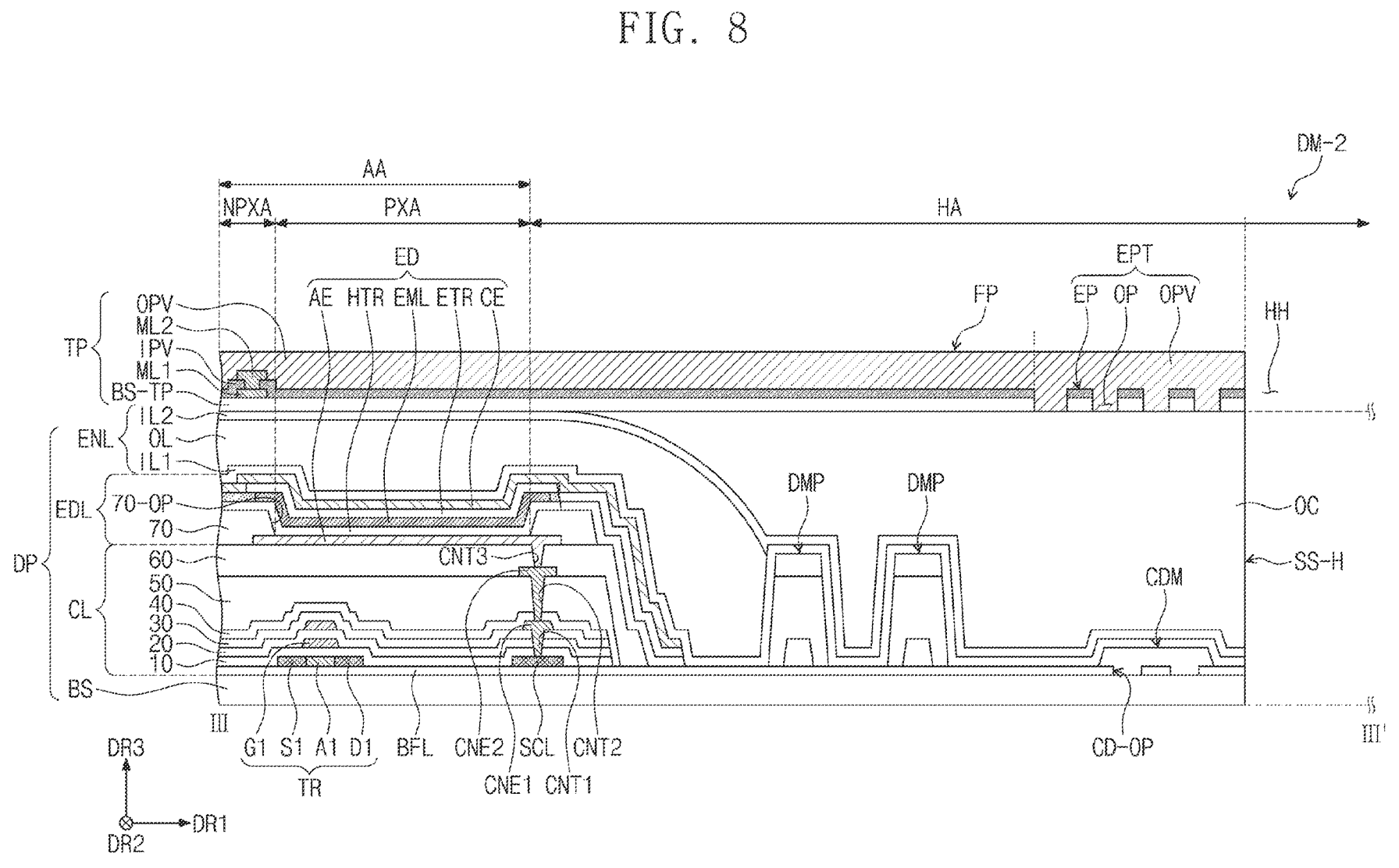

In a display module DM-2 illustrated in FIG. 8, a protruding pattern part EPT may include a plurality of protrusions EP disposed on a planarization layer OC to protrude from a top surface of the planarization layer OC, at least one recess part OP defined between the protrusions EP, and a cover insulating layer OPV that is filled into the recess part OP and covers the protrusions EP. Also, each of the protrusions EP may include a base insulating layer BS-TP and a sensing insulating layer IPV.

That is, in an embodiment, the protrusions EP provided by patterning the base insulating layer BS-TP of the input sensor layer TP and the sensing insulating layer IPV in a hole area HA adjacent to a through-hole HH and the cover insulating layer OPV covering the protrusions EP, filled into the recess part OP, and extending from a flat part FP may be provided.

In the display module DM-2 illustrated in FIG. 8, a sidewall SS-H defining the through-hole HH may include an exposed surface of a portion of the display layer DP, an exposed surface of the planarization layer OC, and exposed surface of the insulating layers BS-TP, IPV, and OPV of the input sensor layer TP. That is, in an embodiment, a cutting line defining the through-hole HH may match edges of the insulating layers BS-TP, IPV, and OPV of the input sensor layer TP which are exposed in the through-hole HH.

However, this embodiment is not limited to the structure illustrated in FIG. 8. For example, the sidewall SS-H defining the through-hole HH according to an embodiment may include an exposed surface of a portion of the sidewall SS-H, an exposed surface of the planarization layer OC, and an exposed surface of the cover insulating layer OPV. That is, in an embodiment, the cutting line defining the through-hole HH may match the edge of the cover insulating layer OPV exposed through the through-hole HH, and edges of the base insulating layer BS-TP and the sensing insulating layer IPV may not be exposed through the through-hole HH.

Figure 9:
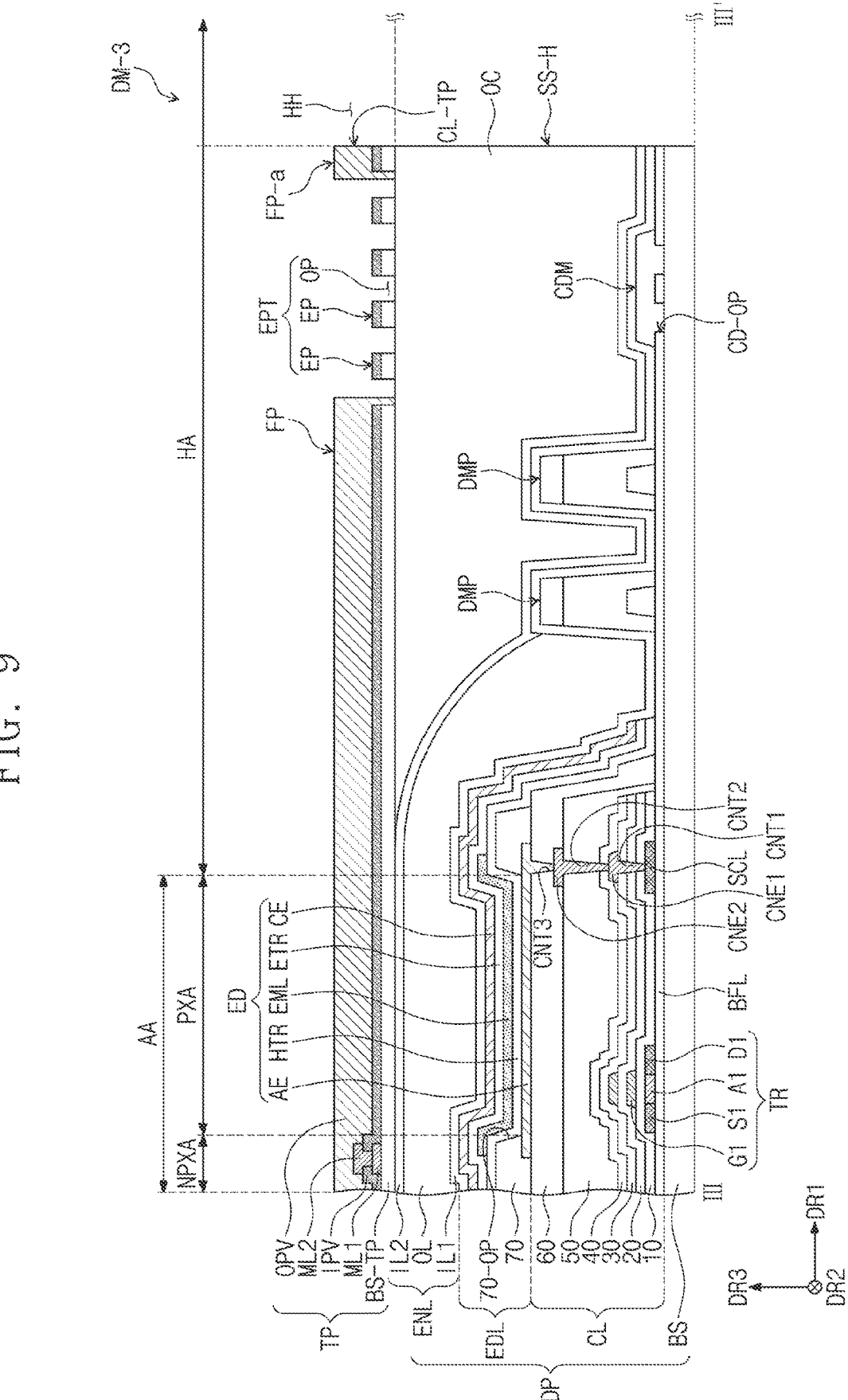
FIG. 9 is a cross-sectional view of a display module according to an embodiment of the inventive concept.

The input sensor layer TP included in the display module DM-3 of FIG. 9 according to an embodiment may correspond to the hole area HA and include a flat part FP, a protruding pattern part EPT, and an edge flat part FP-a. The edge flat part FP-a may be disposed between the protruding pattern part EPT and the through-hole HH.

The edge flat part FP-a may include a base insulating layer BS-TP, a sensing insulating layer IPV, and a cover insulating layer OPV which are sequentially laminated. In the display module DM-3 of FIG. 9 according to an embodiment, the protrusions EP may include a base insulating layer BS-TP and a sensing insulating layer, like the display module DM-1 of FIG. 7 according to the foregoing embodiment, but may not include a cover insulating layer OPV.

In the display module DM-3 according to an embodiment, the protruding pattern part EPT may overlap a crack dam CDM, the flat part FP may overlap a dam part DMP, and the edge flat part FP-a may not overlap the crack dam CDM in a plan view to define a sidewall SS-H of the through-hole HH. That is, a cutting line CL-TP defining the through-hole HH may include an exposed surface of the edge flat part FP-a including the base insulating layer BS-TP, the sensing insulating layer IPV, and the cover insulating layer OPV, which are sequentially laminated.

Figure 10:
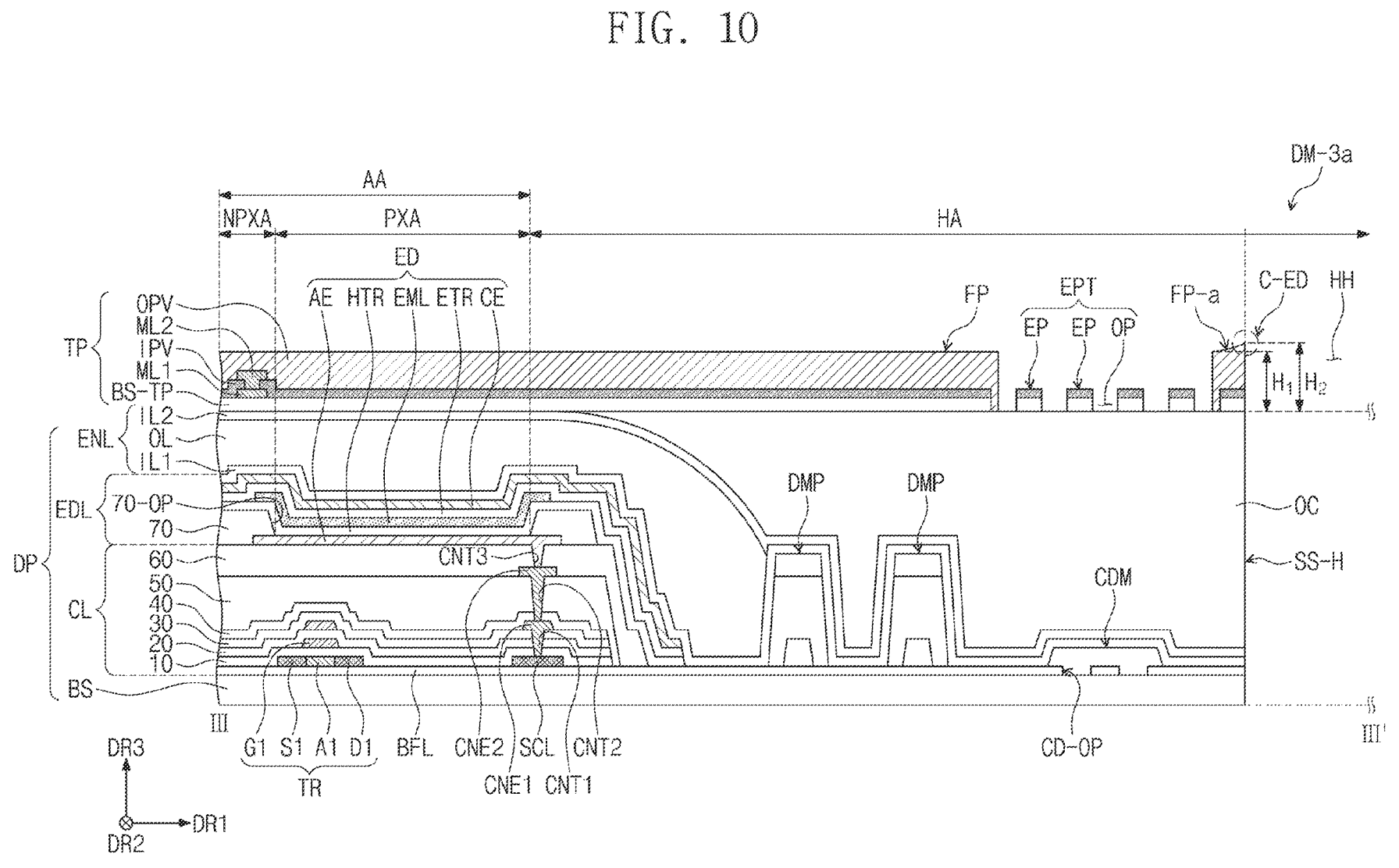

The display module DM-3*a* of FIG. 10 according to an embodiment has a difference in shape of a top surface of the edge flat part FP-a when compared to the display module DM-3 of FIG. 9 according to the foregoing embodiment. Referring to FIG. 10, a height H2 of the upper surface of the cover insulating layer OPV at a portion adjacent to the through-hole HH may be greater than a height H1 of a top surface of the cover insulating layer OPV at a portion spaced apart from the through-hole HH. In an embodiment, the top surface of the edge flat part FP-a may correspond to the top surface of the cover insulating layer OPV, and a height of the top surface of the cover insulating layer OPV at the edge flat part FP-a may be a height from the top surface of the planarization layer OC to a top surface of the cover insulating layer OPV.

In an embodiment, a top surface edge C-ED of the edge flat part FP-a adjacent to the through-hole HH may have a shape that ascends in a direction away from the planarization layer OC. That is, when the through-hole HH is processed, the cover insulating layer OPV may be deformed, and the top surface of the cover insulating layer OPV may ascend upward at a portion adjacent to the through-hole HH.

Unlike in the display module DM-2 according to an embodiment described with reference to FIG. 8, the top surface of the protruding pattern part EPT adjacent to the through-hole HH may ascend in a direction away from the planarization layer OC.

However, the embodiment of the inventive concept is not limited thereto. For example, the exposed surfaces of the insulating layers of the input sensor layer TP constituting the sidewall SS-H defining the through-hole HH may not be parallel to the plane defined by the second directional axis DR2 and the third directional axis DR3, but may be inclined.

Figure 11:
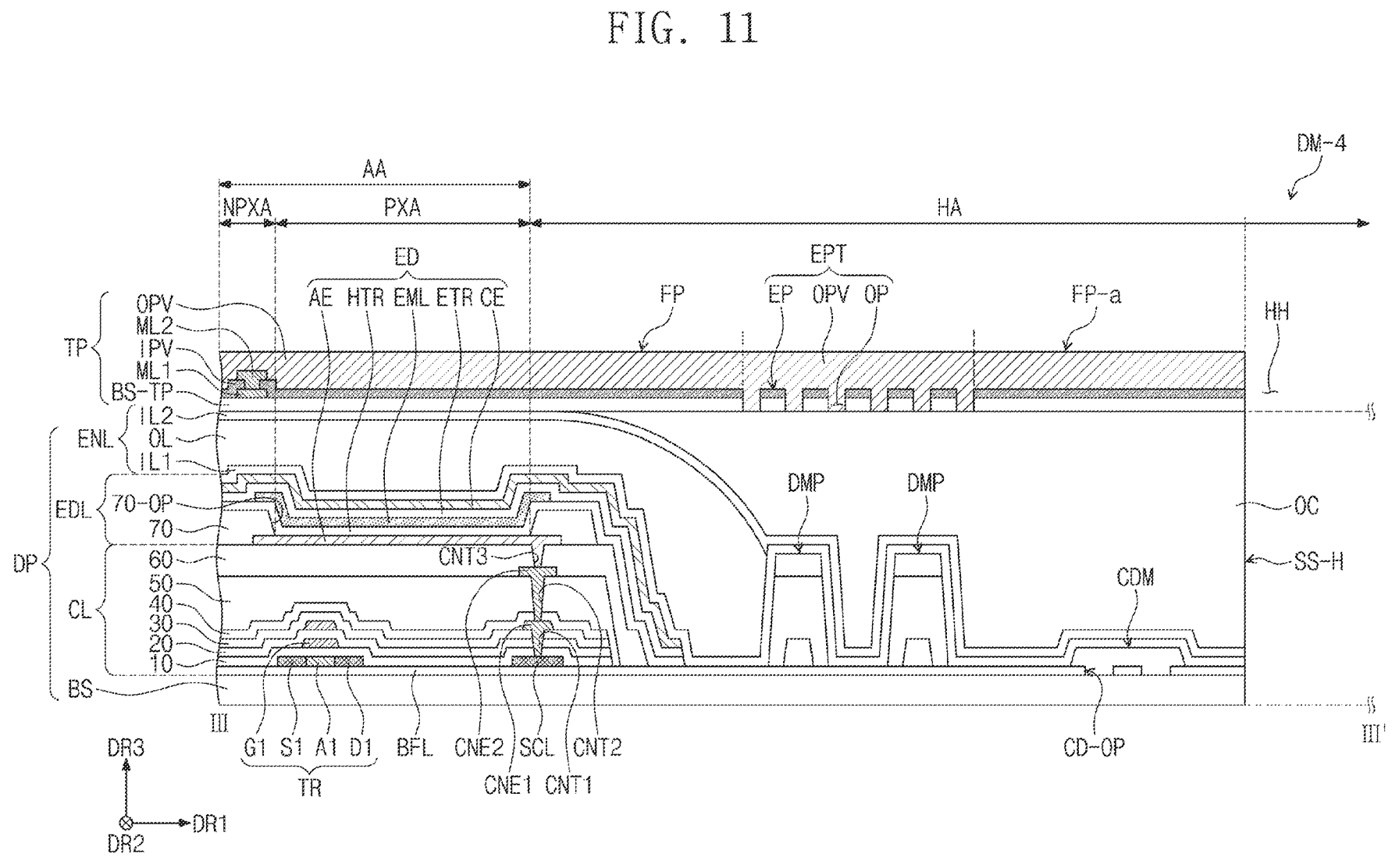

Referring to FIG. 11, in a display module DM-4 according to an embodiment, a protruding pattern part EPT may overlap a dam part DMP in a plan view. That is, in an embodiment, the protruding pattern part EPT may be spaced apart from a through-hole HH and disposed to be adjacent to a display area AA.

In an embodiment, the protruding pattern part EPT may overlap the dam part DMP and may not overlap a crack dam CDM in a plan view. An input sensor layer TP may include an edge flat part FP-a disposed between the protruding pattern part EPT and the through-hole HH. The edge flat part FP-a may overlap the crack dam CDM.

The protruding pattern part EPT may include a plurality of protrusions EP disposed on a planarization layer OC to protrude from a top surface of the planarization layer OC, at least one recess part OP defined between the protrusions EP, and a cover insulating layer OPV filled into the recess part OP and covering the protrusions EP. Also, each of the protrusions EP may include a base insulating layer BS-TP and a sensing insulating layer IPV. In the display module DM-4 according to an embodiment, the cover insulating layer OPV may be disposed on an entire input sensor layer TP corresponding to a hole area HA to reduce a height difference on a top surface of the input sensor layer TP.

In the display module DM-4 illustrated in FIG. 11, a sidewall SS-H defining the through-hole HH may include an exposed surface of a portion of the display layer DP, an exposed surface of the planarization layer OC, and exposed surface of the insulating layers BS-TP, IPV, and OPV of the input sensor layer TP. That is, in an embodiment, a cutting line defining the through-hole HH may match edges of the insulating layers BS-TP, IPV, and OPV of the input sensor layer TP, which are exposed in the through-hole HH.

Figure 12:
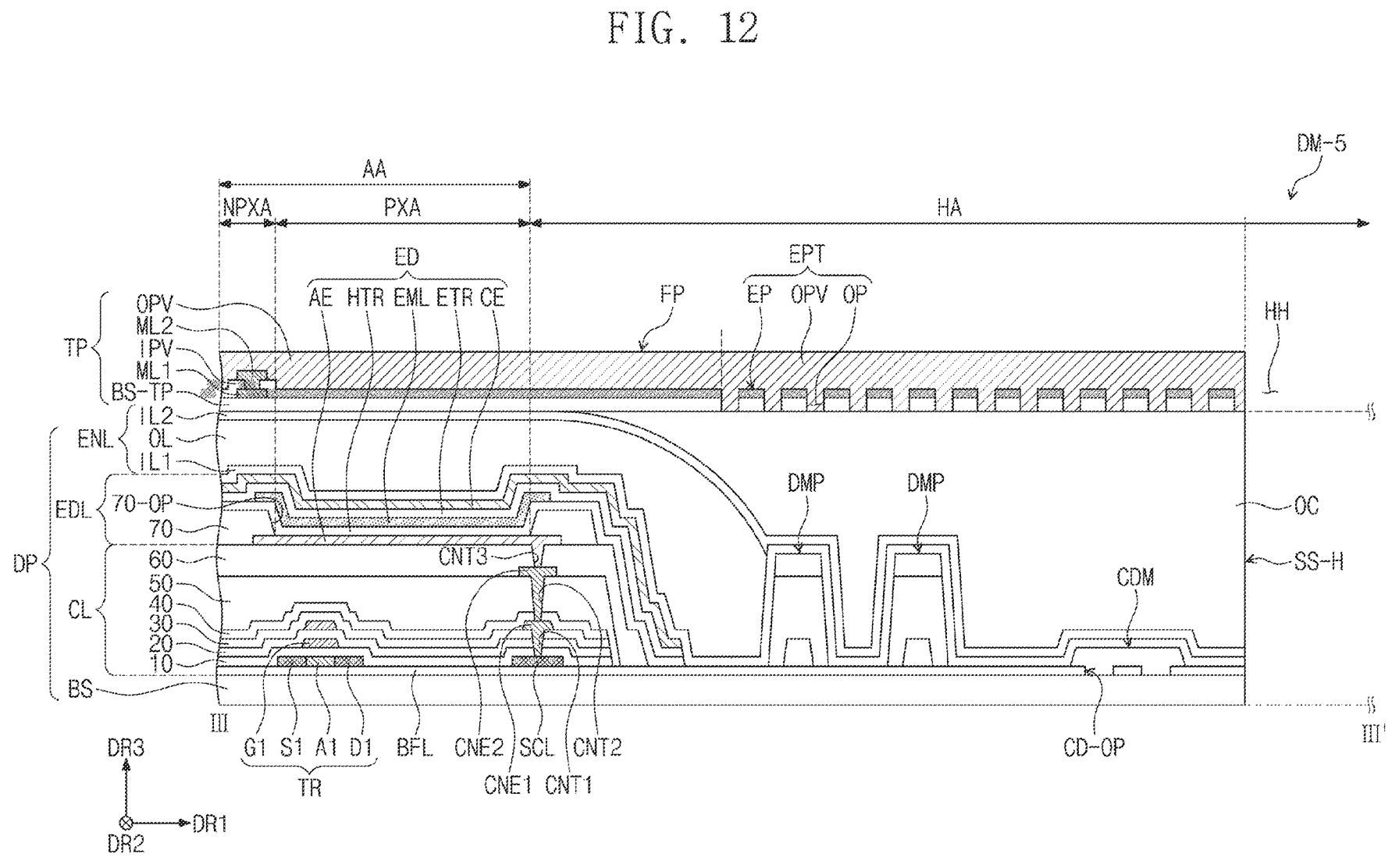

In a display module DM-5 of FIG. 12 according to an embodiment, when compared to the display module DM-2 of FIG. 11 according to the foregoing embodiment, there is a difference in that a protruding pattern part EPT is expanded up to a dam part DMP. Each of protrusions EP of the protruding pattern part EPT may overlap a crack dam CDM and the dam part DMP in a plan view.

Each of the protrusions EP may include a base insulating layer BS-TP and a sensing insulating layer IPV. The protruding pattern part EPT may include a cover insulating layer OPV covering the protruding parts EP. In one embodiment, a sidewall SS-H of a through-hole HH may include an exposed surface of a portion of the display layer DP, an exposed surface of a planarization layer OC, and an exposed surface of the cover insulating layer OPV.

Unlike illustrated in FIG. 12, a top surface edge of the cover insulating layer OPV adjacent to the through-hole HH may be deformed upward in a direction away from the planarization layer OC as described in FIG. 10. Alternatively, an exposed surface of the cover insulating layer OPV constituting the sidewall SS-H may be provided to have an inclination with respect to the top surface of the planarization layer OC.

The display modules illustrated in FIGS. 6 to 12 may correspond to examples according to embodiments including the protruding pattern part EPT disposed around the through-hole HH, but are not limited to the shapes according to the embodiments. In the embodiment described with reference to FIGS. 6 to 12, the position of the protruding pattern part EPT, the type of the insulating layer constituting the protruding parts EP included in the protruding pattern part EPT, and the configuration of the through-hole HH defining the through-hole HH may be variously combined with each other.

Figure 13:
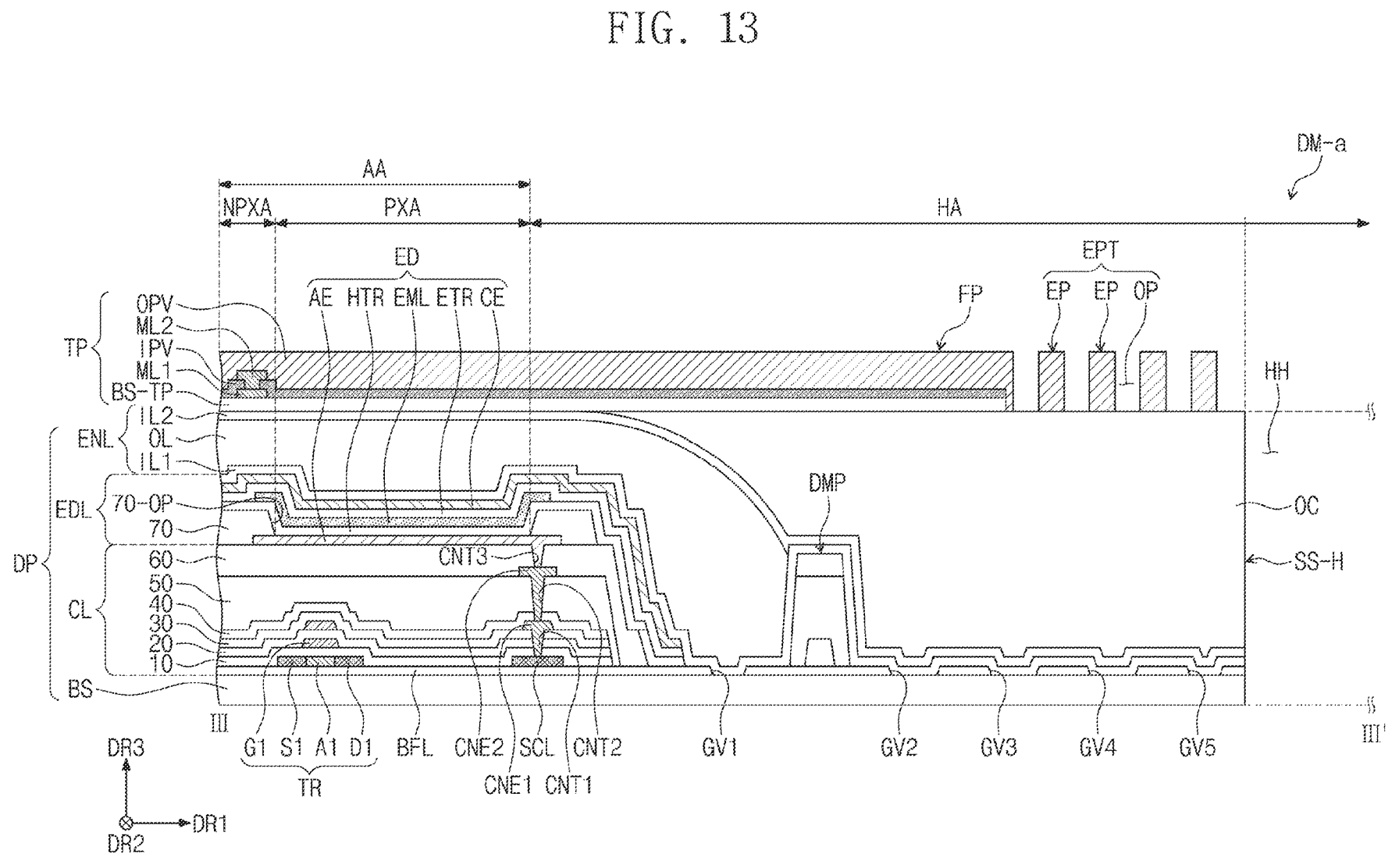

A display module DM-a of FIG. 13 according to an embodiment has some differences in configuration of a display layer DP when compared to the display module DM of FIG. 6 according to the foregoing embodiment.

In the display module DM-a of FIG. 13, a plurality of grooves GV1 to GV5 may be defined in the display layer DP. The grooves GV1 to GV5 may be defined in a circuit layer CL. For example, the grooves GV1 to GV5 may be defined in a buffer layer BFL and may be recessed portions that are recessed toward a base layer BS. In FIG. 13, the first to fifth grooves GV1 to GV5 are illustrated, but the number of grooves is not limited thereto.

Although not shown, in a plan view, each of the grooves GV1 to GV5 may have a shape completely surrounding a through-hole HH. The grooves GV1 to GV5 may block a permeation path of external moisture or oxygen to prevent elements disposed on the display area AA from being damaged. Also, the grooves GV1 to GV5 may serve to block propagation of cracks that may occur during forming of the through-hole HH. The display module DM-a according to an embodiment may not include a crack dam, but may include the plurality of grooves GV1 to GV5 disposed adjacent to the through-hole HH.

FIG. 13 illustrates a structure in which one groove GV1 is defined between the display area AA and a dam part DMP which is disposed inside of the through-hole HH, but the embodiment is not limited thereto. A plurality of grooves may be defined between the display area AA and the dam part DMP, or, unlike this, all the grooves GV1 to GV5 may be defined between the dam part DMP and the through-hole HH.

In an embodiment described with reference to FIG. 13, a protruding pattern part EPT may include protrusions EP and at least one recess part OP defined between the protrusions EP. A top surface of the planarization layer OC may be exposed in the recess part OP. Also, in the display module DM-a according to an embodiment, the protrusion EP may be provided as a cover insulating layer OPV.

In an embodiment, the protruding pattern part EPT may overlap some of the grooves GV4 and GV5, and the remaining grooves GV1 to GV3 may overlap a flat part FP. However, the embodiment of the inventive concept is not limited thereto. When the protruding pattern part is disposed to overlap at least one of the grooves GV1 to GV5, various shapes of the protruding pattern part described with reference to FIGS. 7 to 12 may be applied to the embodiment described with reference to FIG. 13.

The display device according to an embodiment includes the hole area, in which the through-hole is defined, and also include the protruding pattern part provided as the insulating layers of the input sensor layer corresponding to the hole area to prevent the cracks that may occur when the through-hole is formed from being propagated toward the display area DA. Therefore, the display device according to an embodiment may prevent the elements on the display area from being damaged to improve reliability and durability.

The display device according to the embodiment of the inventive concept may include the protruding pattern parts formed as the insulating layer of the input sensor layer in the hole area, in which the through-hole is defined, to prevent the cracks from being propagated toward the display area, thereby improving the reliability and the durability.

It will be apparent to those skilled in the art that various modifications and deviations can be made in the inventive concept. Thus, it is intended that the present disclosure covers the modifications and deviations of this invention provided they come within the scope of the appended claims and their equivalents.

Accordingly, the technical scope of the inventive concept should not be limited to the contents described in the detailed description of the specification, but should be determined by the claims.

What is claimed is:

1. A display device comprising:
a display layer comprising a display area, a hole area disposed on a base layer, and a dam part disposed on the base layer to correspond to the hole area, the hole area being disposed adjacent to the display area and including a through-hole formed through the base layer;
an organic planarization layer disposed on the base layer in an area corresponding to the hole area only; and
an input sensor layer disposed on the display layer and comprising a flat part and a protruding pattern part surrounding the through-hole in a plan view,
wherein the input sensor layer comprises:
a base insulating layer;
a sensing insulating layer on the base insulating layer;
a cover insulating layer on the sensing insulating layer;
a first conductive layer directly on the base insulating layer; and
a second conductive layer electrically connected to the first conductive layer through a hole defined in the sensing insulating layer,
wherein the flat part includes the base insulating layer, the sensing insulating layer, the cover insulating layer, the first conductive layer, and the second conductive layer, and the protruding pattern part includes the cover insulating layer,
wherein the dam part protrudes toward the organic planarization layer, and the dam part overlaps the flat part in the plan view, wherein the protruding pattern part is disposed directly on the organic planarization layer to contact the organic planarization layer, and
wherein a height from the base layer to an upper surface of the protruding pattern part in the hole area disposed adjacent to the through hole corresponds to a height from the base layer to an upper surface of the input sensor layer in the display area, and
the protruding pattern part comprises a plurality of protrusions, and every protrusion of the protruding pattern part disposed on the base layer extends directly from a top surface of the organic planarization layer and has a same height as each other from the base layer.

2. The display device of claim 1, wherein the protruding pattern part further comprises a recess part defined between the protrusions.

3. The display device of claim 2, wherein each of the protrusions has a ring shape completely surrounding the through-hole in the plan view.

4. The display device of claim 2, wherein a sidewall of the through-hole, which defines the through-hole, comprises an exposed surface of a portion of the display layer and an exposed surface of the organic planarization layer.

5. The display device of claim 2, wherein the display layer further comprises:
a circuit layer disposed on the base layer;
a display element layer disposed on the circuit layer; and
an encapsulation layer configured to cover the display element layer.

6. The display device of claim 5, wherein the display layer further comprises
a crack dam disposed on the base layer between the dam part and the through-hole, protruding toward the organic planarization layer, and having a height less than that of the dam part.

7. The display device of claim 6, wherein the crack dam overlaps the protruding pattern part in the plan view.

8. The display device of claim 5, wherein the display layer comprises a plurality of grooves that are concavely recessed in a direction of the base layer to correspond to the hole area and are defined in the circuit layer, and the protruding pattern part overlaps at least one of the grooves in the plan view.

9. The display device of claim 1, wherein the protrusions only comprise the cover insulating layer.

10. The display device of claim 1, wherein the height from the base layer to the upper surface of the protruding pattern part in the hole area disposed adjacent to the through hole is equal to the height from the base layer to the upper surface of the input sensor layer in the display area.

11. A display device comprising:
a display layer comprising a display area and a hole area disposed on a base layer, the hole area being disposed adjacent to the display area and including a through-hole formed through the base layer;
an organic planarization layer disposed on the base layer in an area corresponding to the hole area only; and
an input sensor layer disposed on the display layer and comprising a base insulating layer, a sensing insulating layer on the base insulating layer, a cover insulating layer on the sensing insulating layer, a first conductive layer directly on the base insulating layer, and a second conductive layer electrically connected to the first conductive layer through a hole defined in the sensing insulating layer, wherein the display layer further comprises:

a circuit layer disposed on the base layer;

a display element layer disposed on the circuit layer;

an encapsulation layer configured to cover the display element layer;

a dam part disposed on the base layer to correspond to the hole area and protruding toward the organic planarization layer; and a crack dam disposed on the base layer to protrude toward the organic planarization layer and disposed between the dam part and the through-hole in an area corresponding to the hole area, wherein the input sensor layer comprises a protruding pattern part disposed directly on the organic planarization layer to contact the organic planarization layer and overlapping the crack dam in a plan view, and a flat part overlaps the dam part in the plan view, wherein the flat part includes the base insulating layer, the sensing insulating layer, the cover insulating layer, the first conductive layer, and the second conductive layer, and the protruding pattern part includes the cover insulating layer, and wherein a height from the base layer to an upper surface of the protruding pattern part in the hole area disposed adjacent to the through hole corresponds to a height from the base layer to an upper surface of the input sensor layer in the display area, and the protruding pattern part comprises a plurality of protrusions, and every protrusion of the protruding pattern part disposed on the base layer extends directly from a top surface of the organic planarization layer and has a same height as each other from the base layer.

12. The display device of claim 11, wherein the plurality of protrusions are formed by the cover insulating layer, and wherein the protruding pattern part comprises a recess part defined between the protrusions to expose the top surface of the organic planarization layer.

13. The display device of claim 12, wherein each of the protrusions has a ring shape completely surrounding the through-hole in the plan view.

14. The display device of claim 11, wherein the height from the base layer to the upper surface of the protruding pattern part in the hole area disposed adjacent to the through hole is equal to the height from the base layer to the upper surface of the input sensor layer in the display area.

15. A display device comprising:

an electronic module; and a display module comprising a display layer and an input sensor layer disposed on a base layer, the display layer including a through-hole formed through the base layer and overlapping the electronic module, and an organic planarization layer surrounding the through-hole and disposed between the display layer and the input sensor layer, wherein the input sensor layer includes a protruding pattern part and a flat part, the input sensor layer comprises:

a base insulating layer;

a sensing insulating layer on the base insulating layer;

a cover insulating layer on the sensing insulating layer;

a first conductive layer directly on the base insulating layer; and a second conductive layer electrically connected to the first conductive layer through a hole defined in the sensing insulating layer, wherein the flat part includes the base insulating layer, the sensing insulating layer, the cover insulating layer, the first conductive layer, and the second conductive layer, and the protruding pattern part is disposed directly on the organic planarization layer to contact the organic planarization layer and to surround the through-hole in a plan view, wherein the display layer comprises a display area, a hole area disposed adjacent to the display area and including the through-hole, and a dam part disposed on the base layer to correspond to the hole area, wherein the dam part protrudes toward the organic planarization layer, and the dam part overlaps the flat part, wherein the organic planarization layer is disposed corresponding to the hole area only, and wherein a height from the base layer to an upper surface of the protruding pattern part in the hole area disposed adjacent to the through hole corresponds to a height from the base layer to an upper surface of the input sensor layer in the display area, and the protruding pattern part includes the cover insulating layer and comprises a plurality of protrusions, and every protrusion of the protruding pattern part disposed on the base layer extends directly from a top surface of the organic planarization layer and has a same height as each other from the base layer.

16. The display device of claim 15, wherein plurality of protrusions include at least one of the base insulating layer, the sensing insulating layer, or the cover insulating layer.

17. The display device of claim 16, wherein the display layer comprises:

a circuit layer disposed on the base layer;

a display element layer disposed on the circuit layer;

an encapsulation layer configured to cover the display element layer; and a crack dam disposed on the base layer to protrude toward the organic planarization layer and disposed between the dam part and the through-hole, and wherein the protruding pattern part overlaps the crack dam in the plan view.

18. The display device of claim 15, wherein the height from the base layer to the upper surface of the protruding pattern part in the hole area disposed adjacent to the through hole is equal to the height from the base layer to the upper surface of the input sensor layer in the display area.

* * * * *